US008954400B2

(12) United States Patent
Brown

(10) Patent No.: US 8,954,400 B2
(45) Date of Patent: Feb. 10, 2015

(54) METHOD, SYSTEM AND PROGRAM PRODUCT FOR MANAGING STRUCTURED DATA

(75) Inventor: Richard H. Brown, Otis Orchards, WA (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 10/940,886

(22) Filed: Sep. 14, 2004

(65) Prior Publication Data

US 2006/0059187 A1    Mar. 16, 2006

(51) Int. Cl.

| G06F 7/00 | (2006.01) |
|---|---|
| G06F 17/00 | (2006.01) |
| G06F 17/30 | (2006.01) |
| H03M 7/30 | (2006.01) |

(52) U.S. Cl.
CPC ............................ *H03M 7/30* (2013.01)
USPC ............................ 707/693; 707/741; 707/803

(58) Field of Classification Search
USPC ............................................. 707/102
See application file for complete search history.

(56) References Cited

U.S. PATENT DOCUMENTS

| 4,843,389 | A | * | 6/1989 | Lisle et al. ...................... 341/106 |
| 5,374,928 | A | * | 12/1994 | Moore et al. ...................... 341/67 |
| 5,561,421 | A | * | 10/1996 | Smith et al. ...................... 341/51 |
| 5,590,317 | A | * | 12/1996 | Iguchi et al. ........................... 1/1 |
| 5,838,963 | A | * | 11/1998 | Griffiths ................................. 1/1 |
| 5,864,860 | A | * | 1/1999 | Holmes .......................... 707/101 |
| 5,951,623 | A | * | 9/1999 | Reynar et al. .................. 708/203 |
| 6,240,213 | B1 | * | 5/2001 | Cho .............................. 382/245 |
| 2002/0065822 | A1 | | 5/2002 | Itani |
| 2003/0025621 | A1 | * | 2/2003 | Christoffersson et al. ..... 341/106 |
| 2003/0154308 | A1 | | 8/2003 | Tang et al. |
| 2005/0010894 | A1 | * | 1/2005 | Potter et al. .................... 717/104 |
| 2005/0144556 | A1 | * | 6/2005 | Petersen et al. ............... 715/513 |

FOREIGN PATENT DOCUMENTS

| JP | 2003157249 A | 5/2003 |
| WO | WO 02052857 A2 | 7/2002 |
| WO | WO 02063775 A2 | 8/2002 |

OTHER PUBLICATIONS

Morrison, Michael et al, "XML Unleashed", Sams Publishing, published Dec. 21, 1999. Chapter 12.*
Liefke, H. et al., "An Extensible Compressor for XML Data," ACM SIGMOD Record, vol. 29, No. 1, Mar. 2000, pp. 57-62.
Liefke, H. et al., "XMill: An Efficient Compressor for XML Data," Proceedings of the 2000 ACM SIGMOD International conference on Management of data, 2000, pp. 153-164.

(Continued)

*Primary Examiner* — Stephan Alvesteffer
(74) *Attorney, Agent, or Firm* — Matthew Chung; Hoffman Warnick LLC

(57) ABSTRACT

An improved solution for managing structured data, and in particular generating compressed data based on the structured data. A schema that defines the structure of the data is used to generate a dictionary. The dictionary includes a set of dictionary entries, each configured to generate compressed data for a corresponding pattern defined by the schema. Additional compression can be implemented based on the structured data itself. The compressed data can be communicated between systems to reduce transmission time.

33 Claims, 4 Drawing Sheets

(56) References Cited

OTHER PUBLICATIONS

Sundaresan, N. et al., "Algorithms and Programming Models for Efficient Representation of XML for Internet Applications," WWW10, May 2001, Hong Kong, pp. 366-375.

Chen, Z. et al., "Query Optimization in Compressed Database Systems," ACM SIGMOD, May 2001, California, pp. 271-282.

Takeda et al., "Processing text files as is: pattern matching over compressed texts, multi-byte character texts, and semi-structured texts", $9^{th}$ International Symposium, SPIRE, 2002, Germany, pp. 170-186 (Abstract only).

\* cited by examiner

METHOD, SYSTEM AND PROGRAM PRODUCT FOR MANAGING STRUCTURED DATA

GOVERNMENT LICENSE RIGHTS

The United States Government has a paid-up license in the invention and the right in limited circumstances to require the patent owner to license others on reasonable terms as provided for by the terms of Contract No. R29T awarded by the U.S. Army Tank-automotive and Armaments Command (TACOM).

BACKGROUND OF THE INVENTION

1. Technical Field

The invention relates generally to managing structured data. Specifically, under the present invention, a dictionary can be generated based on structured data in a format such as extensible markup language (XML) for use in compressing and/or decompressing the structured data.

2. Background Art

Extensible markup language (XML) has become the format of choice for transmitting data over networks such as the Internet. Additionally, increasingly diverse computing devices are communicating with other computing devices that communicate over the Internet. As a result, it is desirable that these other computing devices be capable of communicating data using XML.

However, the character-based format for XML makes it an inefficient format for transmitting data. This becomes a substantial problem when the network uses a low baud rate for communicating the data. In order to reduce the transmission time, the data can be compressed prior to transmission and then decompressed after being received. General purpose compression algorithms such as Lempel-Ziv-Welsh (LZW) can obtain approximately fifty percent compression of typical files. However, these algorithms do not use the structure of XML or other structured data to perform compression. Further, some applications require a higher compression rate to obtain a reasonable transmission period.

As a result, a need exists for an improved solution for managing structured data. In particular, a need exists for a method, system and program product that generate a dictionary based on the structure of the data, and use the dictionary to compress/decompress the structured data.

SUMMARY OF THE INVENTION

The invention provides a solution in which structured data can be compressed and/or decompressed using a dictionary. Specifically, under the present invention, a schema that defines a structure for the structured data is used to generate a dictionary. The dictionary can then be used to compress and decompress the structured data. In particular, the dictionary will include a set (one or more) of dictionary entries that each include a codec component for compressing/decompressing a corresponding pattern in the schema. When the pattern is recognized in structured data, the codec component is selected to generate the compressed data. In this manner, the structure of the data can be used to significantly reduce the size of the compressed data. Additional schemes can be used to further reduce the size of the compressed data. For example, string data can be compressed, and numeric values that are included in the string data can be stored in a numeric fashion. Still further, additional compression can be performed based on the content of the structured data. For example, a string that occurs multiple times can be stored once and referenced for each occurrence. In addition to the schema, a hints document can also be provided to incorporate additional compression schemes that are based on one or more attributes of structured data generated using the schema. As a result, the invention provides an improved solution for generating compressed data that can have a significantly smaller size than the structured data.

A first aspect of the invention provides a method of generating a dictionary for managing structured data, the method comprising: obtaining a schema that defines a structure for the structured data; detecting at least one pattern in the schema; obtaining a codec component based on the at least one pattern, wherein the codec component generates compressed data based on the at least one pattern; generating a dictionary entry based on the codec component and the at least one pattern; and adding the dictionary entry to the dictionary.

A second aspect of the invention provides a method of managing structured data, the method comprising: obtaining a dictionary that includes at least one dictionary entry that includes a codec component for processing a pattern defined in a schema that defines a structure for the structured data; detecting the pattern in the structured data; selecting the codec component based on the pattern; and generating compressed data based on the structured data using the codec component.

A third aspect of the invention provides a system for generating a dictionary for managing structured data, the system comprising: a plurality of pattern matchers, wherein each of the plurality of pattern matchers detects a pattern in a schema that defines a structure for the structured data; a pattern system for detecting at least one pattern in the schema using one of the plurality of pattern matchers; a codec system for obtaining a codec component based on the one of the plurality of pattern matchers, wherein the codec component can generate compressed and decompressed data based on the at least one pattern; and a dictionary system for generating a dictionary entry based on the codec component and the at least one pattern and adding the dictionary entry to the dictionary.

A fourth aspect of the invention provides a system for managing structured data, the system comprising: a translation system for generating a dictionary based on a schema that defines a structure for the structured data, wherein the dictionary includes at least one dictionary entry that includes a codec component that generates compressed data based on a pattern in the structured data; and a compression system for detecting the pattern in the structured data and generating compressed data based on the structured data and the at least one dictionary entry.

A fifth aspect of the invention provides a program product stored on a recordable medium for generating a dictionary for managing structured data, which when executed comprises: program code for obtaining a schema that defines a structure for the structured data; program code for detecting at least one pattern in the schema; program code for obtaining a codec component based on the at least one pattern, wherein the codec component generates compressed data based on the at least one pattern; program code for generating a dictionary entry based on the codec component and the at least one pattern; and program code for adding the dictionary entry to the dictionary.

A sixth aspect of the invention provides a system for deploying an application for generating a dictionary for managing structured data, the system comprising: a computer infrastructure being operable to: obtain a schema that defines a structure for the structured data; detect at least one pattern in the schema; obtain a codec component based on the at least one pattern, wherein the codec component generates compressed data based on the at least one pattern; generate a dictionary entry based on the codec component and the at least one pattern; and add the dictionary entry to the dictionary.

A seventh aspect of the invention provides computer software embodied in a propagated signal for managing structured data, the computer software comprising instructions to cause a computer system to perform the following functions: obtain a dictionary that includes at least one dictionary entry that includes a codec component for processing a pattern defined in a schema that defines a structure for the structured data; detect the pattern in the structured data; select the codec component based on the pattern; and generate compressed data based on the structured data using the codec component.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, the invention provides a solution in which structured data can be compressed and/or decompressed using a dictionary. Specifically, under the present invention, a schema that defines a structure for the structured data is used to generate a dictionary. The dictionary can then be used to compress and decompress the structured data. In particular, the dictionary will include a set (one or more) of dictionary entries that each include a codec component for compressing/decompressing a corresponding pattern in the schema. When the pattern is recognized in structured data, the codec component is selected to generate the compressed data. In this manner, the structure of the data can be used to significantly reduce the size of the compressed data. Additional schemes can be used to further reduce the size of the compressed data. For example, string data can be compressed, and numeric values that are included in the string data can be stored in a numeric fashion. Still further, additional compression can be performed based on the content of the structured data. For example, a string that occurs multiple times can be stored once and referenced for each occurrence. In addition to the schema, a hints document can also be provided to incorporate additional compression schemes that are based on one or more attributes of structured data generated using the schema. As a result, the invention provides an improved solution for generating compressed data that can have a significantly smaller size than the structured data.

Figure 1:
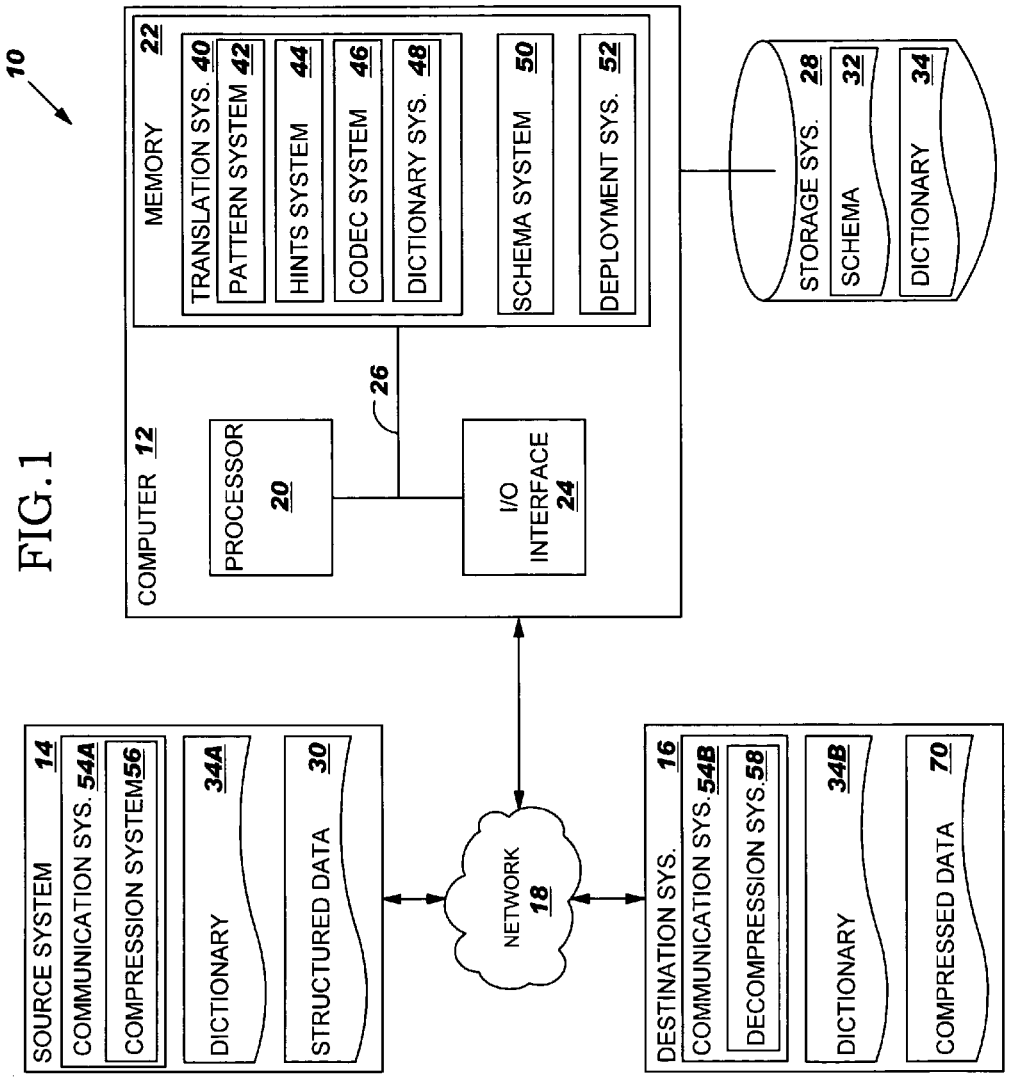
FIG. 1 shows an illustrative system for managing structured data.

Turning to the drawings, FIG. 1 shows an illustrative system 10 for managing structured data 30. In general, a schema 32 that defines a structure for structured data 30 is used to generate a dictionary 34. It is understood that schema 32 and/or structured data 30 can comprise any data type and format. In one embodiment, schema 32 defines an extensible markup language (XML) hierarchical tree structure that is used to generate structured data 30 that comprises data in a character format such as American Standard Code for Information Interchange (ASCII) or the like. However, it is understood that the invention can be applied to various types and/or formats for data, e.g., a Standard Generalized Markup Language (SGML) schema, the Unicode data format, etc.

In any event, dictionary 34 can be provided to each system that may compress and/or decompress structured data 30. In one embodiment, computer 12 generates dictionary 34 and then communicates a copy of dictionary 34A-B to a source system 14 and a destination system 16. Source system 14 can use dictionary 34A to generate compressed data 70 based on structured data 30, and subsequently transmit compressed data 70 to destination system 16. Destination system 16 can use dictionary 34B to decompress the compressed data to recreate at least a portion of structured data 30.

As shown, computer 12, source system 14, and/or destination system 16 can communicate with each other over one or more networks 18. Each network 18 can comprise any type of communications link. For example, network 18 can comprise an addressable connection in a client-server (or peer-to-peer) environment that may utilize any combination of wireline and/or wireless transmission methods. To this extent, computer 12, source system 14, and/or destination system 16 may utilize conventional network connectivity, such as Token Ring, Ethernet, WiFi or other conventional communications standards. Further, network 18 can comprise any combination of various types of networks, including the Internet, a wide area network (WAN), a local area network (LAN), a virtual private network (VPN), etc. Where computer 12, source system 14, and/or destination system 16 communicate via the Internet, connectivity could be provided by conventional TCP/IP sockets-based protocol, and computer 12, source system 14, and/or destination system 16 could utilize an Internet service provider to establish connectivity.

In any event, computer 12, source system 14, and/or destination system 16 comprise any type of computing devices capable of communicating with one or more other computing devices and/or interacting with one or more users (not shown). Illustrative computing devices include a server, a client, a desktop computer, a laptop, a handheld device, a mobile phone, a pager, a personal data assistant, an embedded control system, etc. To this extent, computer 12 is shown including a processor 20 a memory 22, an input/output (I/O) interface 24, a bus 26, and a storage system 28. In general, processor 20 executes computer program code such as translation system 40, that is stored in memory 22 and/or storage system 28. While executing computer program code (e.g., translation system 40), processor 20 can read and/or write data to/from memory 22, storage system 28, and/or I/O interface 24. Bus 26 comprises any solution for providing a communication link between each of the components in computer 12.

It is understood that computer 12 is only illustrative of various possible combinations of hardware. For example, processor 20 may comprise a single processing unit, or be distributed across one or more processing units in one or more locations, e.g., on a client and server. Similarly, memory 22 and/or storage system 28 can comprise any combination of various types of data storage and/or transmission media that reside at one or more physical locations. I/O interface 24 can comprise any system for exchanging information with one or more users and/or other computing devices (e.g., source system 14 and destination system 16) through one or more I/O devices (not shown). Further, it is understood that source system 14 and destination system 16 typically include similar elements (e.g., processor, memory, I/O interface, etc.) as shown for computer 12. These have not been separately shown and described for brevity.

Translation system 40 can generate dictionary 34B based on schema 32. In general, translation system 40 will generate dictionary 34 once for each unique schema 32. Subsequently, as discussed further below, copies of dictionary 34A-B can be deployed and used any number of times to compress and/or decompress structured data 30. Initially, schema 32 can be obtained by translation system 40 from schema system 50. Schema system 50 can comprise any type of system for generating schema 32. For example, schema 32 can comprise a definition of an XML hierarchical tree structure, and schema system 50 can comprise one or more tools used to define schema 32. It is understood that while schema system 50 is shown as a unique system from translation system 40, the two systems could be implemented as a single system (e.g., a single software product).

In any event, translation system 40 is shown including a pattern system 42, a hints system 44, a codec system 46, and a dictionary system 48. In general, pattern system 42 can detect one or more patterns in schema 32. For each detected pattern, codec system 46 can obtain a codec component that processes structured data 30 having the pattern, and dictionary system 48 can generate a dictionary entry in dictionary 34 based on the codec component and/or pattern. Hints system 44 can provide a hints document that also can be used to generate one or more dictionary entries for dictionary 34. Operation of each of these systems is further discussed with reference to FIG. 2.

Figure 2:
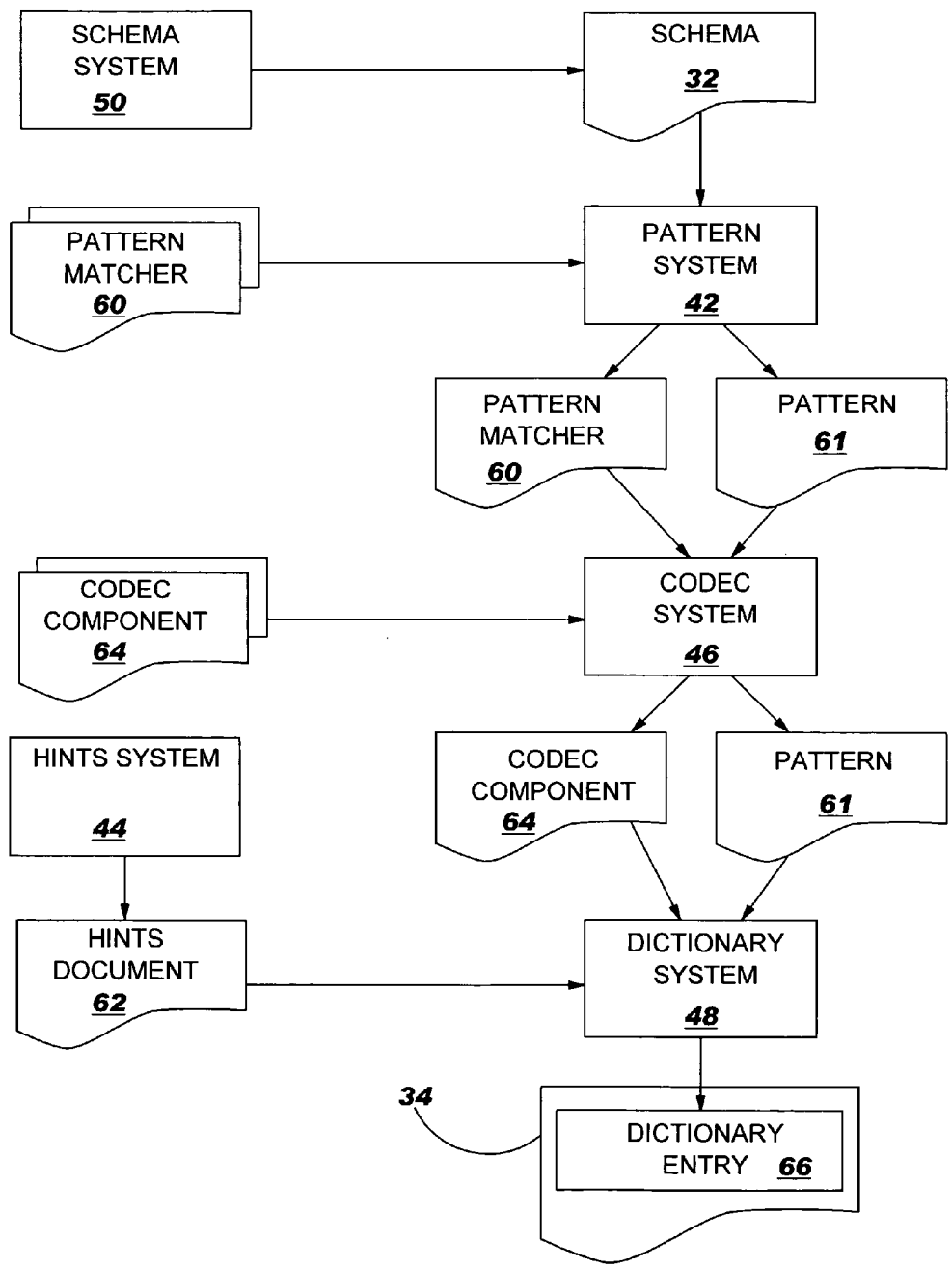
FIG. 2 shows an illustrative data flow between various systems in the translation system of FIG. 1.

FIG. 2 shows an illustrative flow diagram for the various systems according to one embodiment of the invention. In particular, schema system 50 can generate and provide schema 32 to pattern system 42 for processing. Pattern system 42 can detect at least one pattern 61 in schema 32. Each pattern 61 can comprise any portion of schema 32 that defines a structure for structured data 30 (FIG. 1). To this extent, various patterns 61 can be detected for elements, attributes, processing instructions, etc., that may be used to generate structured data 30 based on schema 32.

In one embodiment, pattern system 42 can obtain/include a plurality of pattern matchers 60. Each pattern matcher 60 can match one or more unique aspects that may be present in pattern 61. As a result, pattern system 42 can use each pattern matcher 60 to detect the various aspects of a corresponding pattern 61 that is present in schema 32. When aspects of pattern 61 match multiple pattern matchers 60, pattern system 42 can select the pattern matcher 60 that is anticipated to provide the greatest compression of the structured data 30 (FIG. 1). For example, the various aspects can be ranked, the number of aspects matched could be considered, etc. In any event, pattern system 42 can associate pattern 61 with the selected pattern matcher 60 and provide the information to codec system 46 for further processing.

Codec system 46 can obtain a codec component 46 based on pattern matcher 60 and/or pattern 61. Each codec component 64 comprises functionality for compressing and decompressing structured data 30 (FIG. 1) having the corresponding pattern 61. In one embodiment, each of a set (one or more) of codec components 64 can be associated with a unique pattern matcher 60 (e.g., in a one-to-one correspondence). When codec system 46 receives pattern matcher 60, codec system 46 can obtain the associated codec component 64. Alternatively, each codec component 64 can be associated with a particular pattern 61. Based on pattern 61, codec system 46 can select the corresponding codec component 64 from the set of codec components 64. In any event, once codec component 64 has been obtained, it can be initialized with the information required to recognize the pattern 61 in structured data 30.

In any event, once codec system 46 has obtained codec component 64, codec system 46 can provide codec component 64 and the corresponding pattern 61 to dictionary system 48. In general, dictionary system 48 generates dictionary 34 based on the pattern(s) 61 present in schema 32. To this extent, dictionary system 48 can generate a dictionary entry 66 for each pattern 61 in schema 32, and add dictionary entry 66 to dictionary 34. Dictionary entry 66 can associate codec component 64 with pattern 61 so that when pattern 61 is detected in structured data 30 (FIG. 1), codec component 64 will be used to generate compressed data 70 (FIG. 1) based on structured data 30. Further, each dictionary entry 66 can include an identifier or the like that is included in compressed data 70 so that the dictionary entry 66 corresponding to the codec component 64 that generated compressed data 70 can be selected to generate decompressed data based on compressed data 70.

Dictionary 34 can further include one or more dictionary entries 66 that implement additional compression schemes to generate compressed data 70 (FIG. 1) based on structured data 30 (FIG. 1). In particular, dictionary 34 can include a dictionary entry 66 that encodes a particular type of data. Various encoding operations can be performed based on the type of data included in structured data 30. For example, when a string is identified in structured data 30, the string can be translated into an encoded string.

In one embodiment, each character of a string can be encoded using the SIXBIT encoding scheme. As is known, SIXBIT encoding uses six bits for each alpha-numeric character and the space character rather than the typical eight bits used for ASCII characters. For other characters that occur in the string, a six bit punctuation indicator can be inserted, followed by a six bit code for the character. Additionally, a string length value can be inserted at the beginning of the compressed string that indicates the number of compressed characters that follow. Alternatively, the end of a string can be determined by inclusion of a termination marker such as the NULL character or the like. In any event, the encoded string can then be stored in compressed data 70.

When structured data 30 (FIG. 1) comprises character data that includes numeric values, the numeric values can be translated into a numeric representation (e.g., two/four byte integer, single/double precision floating point, etc.). Typically, the numeric representation of a value will occupy fewer bits than the corresponding character representation of the number. For some complex values, such as coordinate locations, hierarchical topic designations, file paths, date/time stamps, telephone numbers, part numbers, etc., modified compression schemes can be used. For example, a base value (e.g., root directory for a file path) could be included as a dictionary entry 66 and compressed data 70 (FIG. 1) could include an indication of the offset from the base value (e.g., remainder of file path).

Still further, dictionary system 48 can generate one or more dictionary entries 66 that implement custom compression techniques based on additional information not included in schema 32. For example, hints system 44 can provide a hints document 62 to dictionary system 48. Hints document 62 can comprise a set (one or more) of hints about the content of data that may be present within structured data 30. Each hint can comprise further information on the data that may be present for a particular pattern 61. For example, schema 32 may include a pattern 61 that has a particular element that will have text data. A hint may indicate that the text data can only comprise one of a dozen values. In this case, dictionary system 48 can generate dictionary entries 66 that each comprise a substitute string for each of the dozen allowed values. It is understood that hints document 62 could be used to modify one or more dictionary entries 66 (e.g., codec component 64) and/or generate one or more additional dictionary entries 66, various alternatives are possible as will be recognized by one skilled in the art.

Returning to FIG. 1, after translation system 40 processes schema 32, dictionary 34 will contain a set of dictionary entries 66 (FIG. 2) that are based on schema 32. In one embodiment, schema 32 can define a tree structure for structured data 30, and dictionary 34 can include a dictionary entry 66 for each possible node in the tree structure. As a result, dictionary 34 can be used to compress and/or decompress structured data 30 that is generated using schema 32. To this extent, deployment system 52 can provide a copy of dictionary 34A-B to each system, e.g., source system 14 and destination system 16, that manages structured data 30, and therefore may compress/decompress structured data 30.

Figure 3:
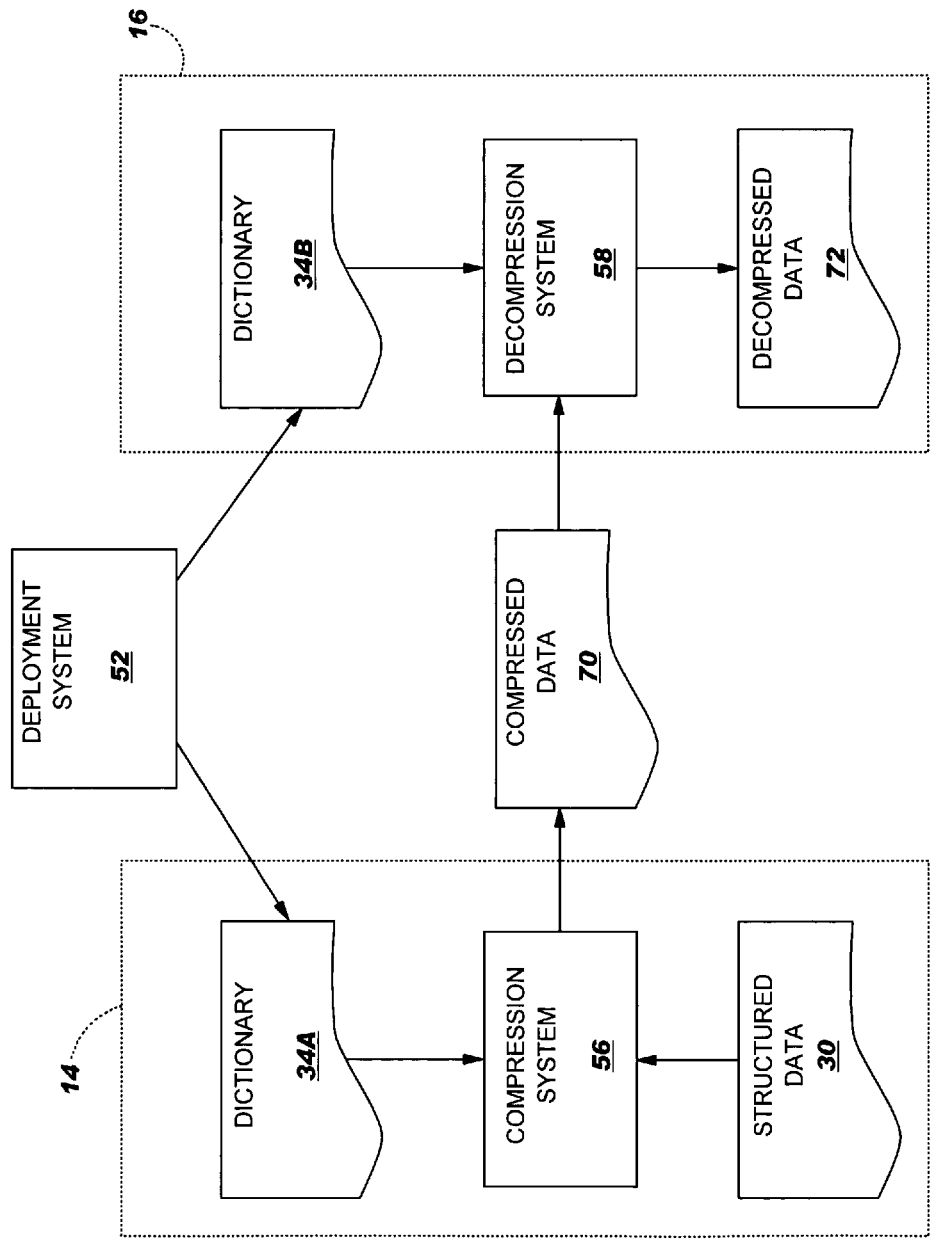
FIG. 3 shows an illustrative data flow between two systems that communicate the compressed data.

FIG. 3 shows an illustrative flow diagram between deployment system 52, source system 14, and destination system 16. Initially, deployment system 52 can provide copies of dictionary 34A-B to source system 14 and destination system 16. To this extent, copies of dictionary 34A-B can be provided during a software package install that occurs prior to the operation of systems 14, 16. For example, source system 14 and/or destination system 16 could comprise computing devices incorporated on a satellite. In this case, source system 14 and destination system 16 can each obtain their respective copies of dictionary 34A-B prior to being launched. In any event, during operation, source system 14 may generate structured data 30 using schema 32 (FIG. 1) and desire to communicate structured data 30 to destination system 16 over network 18. Further, network 18 may have a low baud rate and/or it may be desired to minimize the transmission time of structured data 30.

In either case, compression system 56 can obtain structured data 30 and generate compressed data 70 based on dictionary 34A and structured data 30. In general, compression system 56 can detect a pattern in structured data 30, select a codec component 64 (FIG. 2) based on the detected pattern, and use codec component 64 to generate compressed data 70 for the pattern based on structured data 30. Compression system 56 can select codec component 64 using dictionary 34A. In particular, compression system 56 can obtain a dictionary entry 66 (FIG. 2) based on the detected pattern and obtain the codec component 64 that corresponds to dictionary entry 66 for use in generating compressed data 70.

Figure 4:
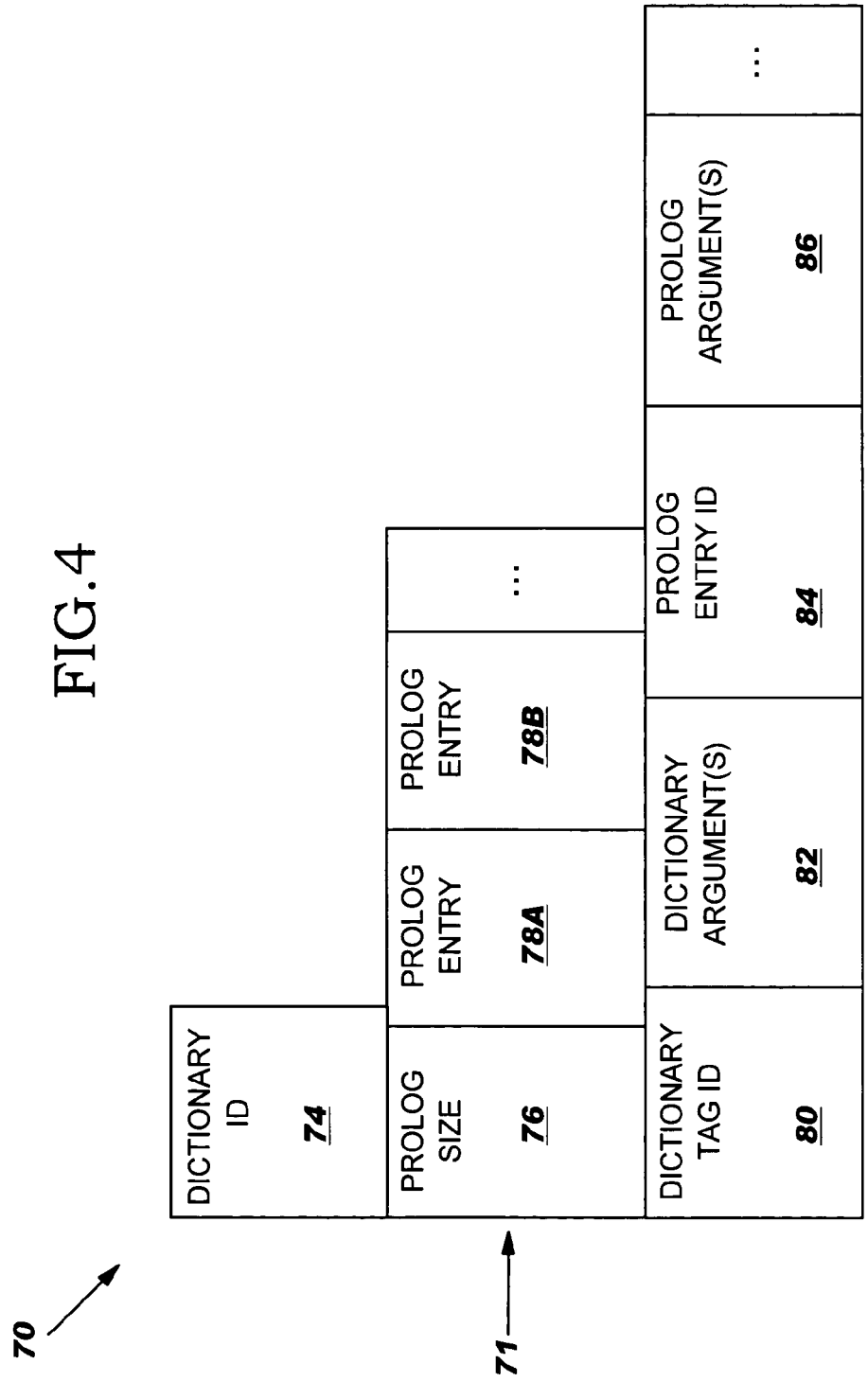
FIG. 4 shows an illustrative configuration for the compressed data.

Compressed data 70 can comprise a byte array that can be incorporated into any message(s) and subsequently sent over any messaging transport. FIG. 4 shows an illustrative configuration for compressed data 70. Initially, compressed data 70 can comprise a dictionary identifier (ID) 74. Dictionary ID 74 can comprise any identification capable of identifying the dictionary 34A (FIG. 1) that was used in generating compressed data 70. In one embodiment, dictionary ID 74 comprises a nibble (four bits) that enable the identification of up to sixteen unique dictionaries 34A. In this manner, an appropriate dictionary 34A can be selected from a plurality of possible dictionaries 34A such as various versions of dictionary 34A, various dictionaries 34A for different schemas 32 (FIG. 1), etc. Compression system 56 can obtain the value for dictionary ID 74 from, for example, a dictionary entry 66 (FIG. 2) that can be generated using hints document 62 (FIG. 2) or the like.

Compression system 56 can also perform one or more data compressions based on the data included in structured data 30 (FIG. 1). For example, compressed data 70 is shown including a prolog portion 71. Prolog portion 71 can comprise a prolog size 76 and zero or more prolog entries 78A-B. Prolog size 76 can indicate the number of prolog entries 78A-B that are included in compressed data 70. Each prolog entry 78A-B can comprise compressed data that is generated based on the content of structured data 30 (FIG. 1). For example, during compression, compression system 56 (FIG. 3) can identify a character string having multiple occurrences within structured data 30. In response, compression system 56 can create prolog entry 78A based on the string. In particular, prolog entry 78A can comprise a compressed representation of the character string. Subsequently, each occurrence of the character string in structured data 30 can reference prolog entry 78A.

Additionally, as discussed above with reference to dictionary entries 66 (FIG. 2), prolog portion 71 also can be used to reduce the space required for complex data items that are detected in structured data 30. For example, structured data 30 may comprise a series of coordinate locations, hierarchical topic designations, file paths, date/time stamps, telephone numbers, part numbers, etc. Frequently, values for these complex data items require a significant number (e.g., four or more) of bytes of data. As a result, compression system 56 can create a prolog entry 78B that comprises a default value of the complex data item. The default value can be selected based on the data in structured data 30 (e.g., most frequent, lowest, median, etc.). In any event, the value of each instance of the complex data item in structured data 30 can be stored in compressed data 70 as a reference to prolog entry 78B and an offset (if necessary) from the value in prolog entry 78B.

In general, compressed data 70 will include one or more dictionary tag IDs 80, which may be followed by one or more dictionary arguments 82. Each dictionary tag ID 80 is used to obtain the corresponding dictionary entry 66 (FIG. 2) from dictionary 34B (FIG. 3), which will include the codec component 64 (FIG. 2) that is required to decompress the corresponding portion of compressed data 70. To this extent, codec component 64 may require one or more dictionary arguments 82 that are used to perform the decompression. Dictionary argument(s) 82 could comprise various settings that can vary from different instances of structured data 30 (FIG. 1). Further, dictionary arguments 82 could comprise data that was generated by codec component 64. In any event, codec component 64 generates decompressed data 72 (FIG. 3) by decompressing the corresponding portion of compressed data 70.

When prolog portion 71 includes one or more prolog entries 78A-B, compressed data 70 will also include one or more prolog entry IDs 84 that are followed by zero or more prolog arguments 86. As stated above, each prolog entry ID 84 can reference a prolog entry 78A-B included in prolog portion 71 of compressed data 70. When prolog entry 78A-B comprises a string or the like, prolog entry ID 84 may not require any prolog arguments 86. However, when prolog entry ID 84 references a prolog entry 78A-B that comprises a complex data item, then one or more prolog arguments 86 may be included to indicate an offset from the corresponding data stored in prolog entry 78A-B.

As discussed herein, compressed data 70 can include several numeric representations. For example, dictionary ID 74, prolog size 76, dictionary tag ID 80, prolog entry ID 84, etc., can each comprise a numeric integer value. In one embodiment, the number of bits used to represent the value can be varied. For example, by default, a byte (eight bits) can be used to represent the integer value. Seven bits of each byte can be used to encode the value (0-127), while the eighth bit can be used to indicate that the number requires another byte. Each byte of the number can be used similarly, so that a four byte value can comprise three bytes having the eighth bit set high, followed by a fourth byte with the eighth bit set low.

By using this representation scheme for numeric representations, the number of bits (e.g., bytes) used to represent lower integer values is reduced. This makes the representation efficient for a small dictionary 34, while not limiting the total number of dictionary entries 66 (FIG. 2) that can be included. Additional actions can be taken to help ensure that low integer values appear more frequently in compressed data 70. For example, dictionary entries 66 can be ordered in dictionary 34 such that dictionary entries 66 that are anticipated to occur more frequently are referenced by a low dictionary tag ID 80. Similarly, prolog entries 78A-B in prolog portion 71 can be arranged so that the most frequent prolog entries 78A-B are referenced by low prolog entry IDs 84. It is understood that while a byte is used as an illustrative default integer length, any number of bits can be used. For example, as discussed above, dictionary ID 74 could comprise a nibble. To this extent, the default length can vary based on the type of numeric representation (e.g., prolog entry ID 84 versus dictionary tag ID 80).

As discussed above, various compression solutions can be used to generate the contents of compressed data 70. As a result, each data item in compressed data 70 can include a data encoding indicator that indicates the compression solution used for the particular data item. In one embodiment, the data encoding indicator comprises a nibble (four bits) in which the various possible values represent a particular encoding solution (up to sixteen). For example, possible values of the data encoding indicator could indicate that the data item comprises a one, two, or four byte integer, single or double precision floating point number, SIXBIT encoded character data, dictionary tag ID 80, prolog entry ID 84, etc. Further, when extra values are available in the data encoding indicator, one or more values can be used to directly represent values that are commonly found in structured data 30. For example, values of the data encoding indicator could be used to represent NULL, the numeric value zero, the numeric value one, etc.

In any event, as shown in FIG. 3, decompression system 58 can generate decompressed data 72 based on dictionary 34B and compressed data 70. In one embodiment, decompressed data 72 comprises an identical copy of structured data 30. Alternatively, decompressed data 72 can comprise a portion of structured data 30 that is recreated for proper processing. Regardless, decompression system 58 processes compressed data 70 using dictionary 34B to generate decompressed data 72.

Further details of decompression system 58 will be discussed with reference to FIG. 3 and the illustrative compressed data shown in FIG. 4. In particular, decompression system 58 can use dictionary ID 74 to select dictionary 34B from a plurality of available dictionaries and/or to confirm that dictionary 34B is identical to the dictionary used to create compressed data 70. When dictionary. 34B does not correspond to the dictionary identified by dictionary ID 74, an error message can be generated and sent to source system 14 indicating that compressed data 70 cannot be decompressed.

Once dictionary 34B has been selected and verified, decompression system 58 can process prolog portion 71. In particular, decompression system 58 can read in prolog size 76 and, for each prolog entry 78A-B, read in and decompress the data. The contents of prolog portion 71 can then be stored in an array or the like in memory for ready access. Once prolog portion 71 has been processed, decompression system 58 can process the remainder of compressed data 70.

For example, decompression system 58 can obtain a dictionary entry 66 (FIG. 2) from dictionary 34B based on compressed data 70. In particular, dictionary tag ID 80 can identify a dictionary entry 66 that is to be used for further processing. Decompression system 58 can obtain dictionary entry 66 and obtain the codec component 64 (FIG. 2) based on dictionary entry 66. Codec component 64 can then be used to generate the portion of decompressed data 72 that corresponds to the portion of structured data 30 that was originally compressed using codec component 64. In particular, codec component 64 can process the data in one or more arguments 82 to create decompressed data 72. Similarly, decompression system 58 can obtain a prolog entry 78A-B based on a prolog entry ID 84 and generate decompressed data 72 based on prolog entry 78A-B and/or one or more prolog arguments 86.

In any event, once complete, decompressed data 72 will comprise at least a portion of structured data 30. In particular, decompressed data 72 may not include data that was included in structured data 30 but was not relevant. For example, structured data 30 may have included white space, comments, etc., that made structured data 30 more readable for a user. This data can be eliminated when structured data 30 is compressed and communicated to a destination system 16 (FIG. 1) for processing.

Returning to FIG. 1, further details of the invention are now discussed with reference to an illustrative implementation in which structured data 30 comprises an XML document 30 (e.g., a text file) that is generated based on schema 32, which comprises an XML schema 32. As is known, XML schema 32 defines an XML document tree structure of elements, properties, text, etc. Each XML document 30 generated based on XML schema 32 includes the structure in an XML document object model (DOM). An XML parser can produce the DOM tree structure using XML document 30. A valid XML document 30 is one that is both well-formed and constructed according to the corresponding XML schema 32. In other words, a valid XML document's DOM tree will conform to XML schema 32. As a result, a valid XML document 30 will have the form expected by dictionary 34.

In generating dictionary 34, each item in XML schema 32 is encoded by a dictionary entry that includes a codec component 64. In order to process XML document 30, the DOM tree structure is produced using an XML parser or the like. If present, a top node of the DOM tree structure is determined, and a corresponding dictionary entry 66 (FIG. 2) is selected from dictionary 34A based on the top node. The codec component 64 (FIG. 2) that corresponds to dictionary entry 66 is then selected and is used to recursively compress the top node and the corresponding subtree. In one embodiment, the subtree is recursively descended and the corresponding codec components 64 generate compressed data 70 based on the corresponding node in the DOM tree. When a top node of the DOM tree structure is not present, a NULL top node can be used, the various first level nodes can be made child nodes of the NULL top node, and processing can continue as described above.

As noted above, decompressed data 72 (FIG. 3) can comprise a reproduction of structured data 30 or only a portion of structured data 30. In the latter case, one or more dictionary entries 66 (FIG. 2) could comprise a codec component 64 (FIG. 2) that ignores one or more types of items that may be included in XML document 30. As a result, the item would not be included in compressed data 70. For example, XML fragments that comprise processing instructions, document type, comments, elements/attributes not explicitly allowed in XML schema 32, and the like, may be ignored and not included in compressed data 70.

In one embodiment, it is desirable that each XML DOM node match at least one dictionary entry 66 (FIG. 2). In this case, at least one pattern matcher 60 (FIG. 2) must match each type of entry that may be present in XML schema 32 and that corresponds to a XML DOM node. This set of pattern matchers 60 will be sufficient to compress and decompress any valid XML document, although compressed data 70 may not include all the data as discussed above. The set of pattern matchers 60 can include, for example, a pattern matcher 60 that matches the top-level document node in a DOM (the root of the document tree) and a pattern matcher 60 that matches a processing instruction node. Each of these nodes can be ignored during compression of the XML document 30.

A pattern matcher 60 (FIG. 2) can also match an element node that is defined in XML schema 32. The name of the element node can be obtained from XML schema 32 and incorporated into the corresponding codec component 64 (FIG. 2). Further, whether XML schema 32 allows the element node to include data also can be incorporated into codec component 64. As is known, the same element node can be defined in multiple places within XML schema 32, each having a unique local definition. In this case, for each such definition, a separate dictionary entry 66 (FIG. 2) can be created for each element node, and each codec component 64 must be provided with enough information to ensure that only the correct dictionary entry 66 is used during compression.

During compression of an element node by compression system 56, the compression algorithm can be applied recursively to the children of the element node in the DOM tree structure. In this case, compressed data 70 that is generated for each element node can include compressed data 70 for each child node as a dictionary argument 82 (FIG. 4). Further, when the element node can include data, then the data for each data child can be encoded in compressed data 70 as part of dictionary arguments 82, prior to the compressed data 70 for each child node. During decompression of compressed data 70, decompression system 58 can first extract any data included for the element node, and then extract the data for each child node from compressed data 70.

A pattern matcher 60 (FIG. 2) can also match any attribute node that is defined in XML schema 32. In this case, dictionary system 48 can generate a dictionary entry 66 (FIG. 2) with the corresponding codec component 66 (FIG. 2), which includes the name of the attribute as defined in XML schema 32. During compression, the appropriate dictionary tag ID 80 (FIG. 4) can be inserted into compressed data 70, and the corresponding attribute value can be provided as a single dictionary argument 82 (FIG. 4). During decompression, the codec component 66 that corresponds to dictionary tag ID 80 is obtained, and the dictionary argument 82 is provided to recreate the attribute node.

Various other pattern matchers 60 (FIG. 2) can be included that match large scale XML structures that may be defined in XML schema 32. For example, when a large number of required attributes can have default values, pattern matcher 60 could generate a dictionary entry 66 (FIG. 2) that comprises a codec component 64 (FIG. 2) that can provide all the default values. In this case, codec component 64 will require an argument 82 (FIG. 2) for each attribute. During compression, any non-defaulted values can be included in the dictionary argument 82 that corresponds to the attribute while the NULL value can be used for the remaining dictionary arguments 82. When XML schema 32 allows child elements and/or data elements, these elements can be handled in the same manner as described above with reference to element nodes.

A similar pattern matcher 60 (FIG. 2) can be used to match an element that may be defined in XML schema 32 as having a relatively small sequence of child elements, each of which has a few, if any, attributes of its own. When the proportion of required child elements and required attributes is sufficiently large, the element can be encoded in a manner similar to the attributes described above, wherein optional values are included in compressed data 70 as dictionary arguments 82 (FIG. 4). Various other possible pattern matchers 60 can be included as will be recognized by one skilled in the art. To this extent, one or more pattern matchers 60 can be customized based on schema 32 and/or hints document 62 (FIG. 2).

As noted previously, compressed data 70 can be transmitted from source system 14 to destination system 16. To this extent, communication system 54A can communicate compressed data 70 over network 18 to destination system 16, which can receive compressed data 70 using communication system 54B. It is understood that while communication systems 54A-B are shown as including compression system 56 and decompression system 58, respectively, each communication system 54A-B can include both compression system 56 and decompression system 58. Alternatively, compression system 56 and/or decompression system 58 can be implemented apart from communication systems 54A-B as a unitary system and/or as part of another computer program product.

As discussed above, network 18 can comprise any type of network. Further, the present invention can provide substantial compression (e.g., approximately ninety percent) of a typical XML document 30. To this extent, compressed data 70 can be sent over narrow bandwidth (e.g., thirty characters per second) networks 18 in far less time than the uncompressed XML document 30. As a result, XML document 30 can be included in additional applications that previously would have required an unreasonable communication time to the data. For example, communication with a remote sight such as a satellite, a mobile telephone, a submarine, etc., and/or over noisy environments such as a power line, can all use the present invention to substantially reduce the communication time.

It is understood that when compressed data 70 is communicated between source system 14 and destination system 16, the data can be encrypted or the like to prevent unauthorized access/modification of compressed data 70. Further, in order to ensure the integrity of compressed data 70, additional data can be included in the message for routing the message and/or to detect when one or more values may have been altered due to transmission error(s). For example, compressed data 70 can be packaged in a message protocol that uses a cyclical redundancy checking (CRC) or the like to confirm that compressed data 70 was transmitted successfully.

Further, it is understood that the teachings of the present invention could be offered as a business method on a subscription or fee basis. For example, translation system 40 could be created, maintained, supported, and/or deployed by a service provider that offers the functions described herein for customers. That is, a service provider could offer to generate and/or deploy dictionary 34 for use in managing structured data 30 as described above. It is understood that the present invention can be realized in hardware, software, a propagated signal, or any combination thereof. Any kind of computer/server system(s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized.

The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of managing structured data, the method comprising:
generating a unique dictionary for each of a set of schemas, wherein the dictionary includes at least one dictionary entry for each pattern in a set of all possible patterns for structured data generated using the corresponding schema, wherein the generating includes, for each schema:
obtaining schema data that defines a set of all possible patterns for structured data generated using the schema, wherein the schema data is obtained without obtaining any structured data generated using the schema;
detecting a pattern in the schema data;
obtaining a codec component based on the pattern, wherein the codec component is configured to generate compressed data based on the pattern and structured data having the pattern;
obtaining a hint for the pattern, wherein the hint identifies all possible values for an element in the pattern;
generating at least one dictionary entry for the pattern based on the codec component, the hint, and the pattern, the at least one dictionary entry enabling selection of the codec component and compression of a value for the element when the pattern is detected in the structured data;
adding the at least one dictionary entry to the dictionary; and
storing the dictionary for later use in compressing structured data generated using the schema, including storing a respective copy of the dictionary as a discrete file on both a source system and a destination system configured to exchange compressed data therebetween;
generating compressed data for the structured data using the dictionary, wherein the generating of the compressed data includes:
adding a dictionary identifier corresponding to the dictionary to the compressed data;
identifying any string having a plurality of occurrences in the structured data;
creating a prolog entry, in the compressed data, for each identified string, after the identifying of the any string; and
referencing the respective prolog entry in the compressed data for each of the plurality of occurrences of the respective identified string; and
using at least one copy of the dictionary with at least two distinct structured data files generated using the respective schema, wherein the using of the at least one copy of the dictionary includes:
using the dictionary identifier to select the dictionary from a plurality of available dictionaries;
processing the prolog entry for each identified string; and
processing a remainder of the compressed data after the processing of the prolog entry for each identified string.

2. The method of claim 1, wherein the detecting includes:
obtaining a plurality of pattern matchers, each pattern matcher configured to match a unique set of aspects of a possible pattern in the schema; and
associating the pattern with one of the plurality of pattern matchers, and wherein the obtaining a codec component includes:
obtaining the codec component identified with the associated pattern matcher; and
initializing the codec component to recognize the pattern in the structured data.

3. The method of claim 2, wherein the associating includes:
matching a plurality of pattern matchers with the pattern; and
selecting one of the plurality of pattern matchers anticipated to provide the greatest compression of structured data having the pattern to associate with the pattern.

4. The method of claim 1, wherein the at least one dictionary entry comprises a plurality of element dictionary entries, each element dictionary entry including a substitute string for one of the possible values for the element in the pattern.

5. The method of claim 1, wherein the schema data defines a tree structure for the set of all possible patterns, and wherein the dictionary includes at least one dictionary entry for each possible node in the tree structure.

6. The method of claim 1, wherein the codec component is further configured to generate decompressed data based on the compressed data and at least one dictionary entry corresponding to the compressed data.

7. The method of claim 1, further comprising deploying a copy of the unique dictionary for a schema for use on a system that manages structured data generated using the schema, wherein the system uses the unique dictionary to compress the structured data generated using the schema.

8. The method of claim 1, further comprising:
detecting another pattern in the schema;
obtaining a codec component based on the another pattern, wherein the codec component generates compressed data based on the another pattern and structured data having the another pattern;
generating a dictionary entry for the another pattern based on the codec component and the pattern, the dictionary entry enabling selection of the codec component when the another pattern is detected in the structured data; and adding the dictionary entry to the dictionary.

9. The method of claim 1, wherein the generating at least one dictionary entry for the pattern includes:

generating a first dictionary entry based on the codec component and the pattern; and generating a second dictionary entry, different from the first dictionary entry, based on the hint and the pattern.

10. A method of managing structured data, the method comprising:

determining a schema used to generate the structured data;

obtaining a dictionary based on the schema data, wherein the dictionary includes at least one dictionary entry for each pattern in a set of all possible patterns for structured data generated using the corresponding schema, generating compressed data for the structured data using the dictionary, wherein the generating includes:

adding a dictionary identifier corresponding to the dictionary to the compressed data; and for each pattern in a set of patterns in the structured data:
detecting the pattern in the structured data;
selecting a codec component from the dictionary based on the detected pattern and a dictionary entry corresponding to the detected pattern;
obtaining compressed data for a value of an element in the pattern from a second dictionary entry corresponding to the element in the pattern; and
generating compressed data for the detected pattern based on the structured data corresponding to the detected pattern using the codec component and the compressed data for the value of the element, the compressed data for the detected pattern including an identifier of the dictionary entry corresponding to the detected pattern and a set of arguments for use by the codec component in generating decompressed data;

identifying any string having a plurality of occurrences in the structured data;

for each identified string, creating a prolog entry in the compressed data based on the string;

adding a prolog size to the compressed data, the prolog size indicating a number of prolog entries included in the compressed data;

referencing the respective prolog entry in the compressed data for each of the plurality of occurrences of the respective identified string; and using at least one copy of the dictionary with at least two distinct structured data files generated using the respective schema, wherein the using of the at least one copy of the dictionary includes:
using the dictionary identifier to select the dictionary from a plurality of available dictionaries;
processing the prolog entry for each identified string; and
processing a remainder of the compressed data after the processing of the prolog entry for each identified string.

11. The method of claim 10, further comprising generating decompressed data based on the compressed data, wherein the generating includes:

obtaining a copy of the respective dictionary for use in decompressing the compressed data based on the dictionary identifier in the compressed data, wherein the copy of the respective dictionary corresponds to the dictionary used to generate the compressed data; and generating decompressed data using the copy of the respective dictionary based on the compressed data.

12. The method of claim 11, further comprising communicating the compressed data from a source system to a destination system prior to the generating decompressed data.

13. The method of claim 11, wherein the generating decompressed data using the copy of the respective dictionary includes:

identifying a dictionary entry in the compressed data, wherein the dictionary entry identifies a codec component;

obtaining the codec component based on the dictionary entry;

generating at least a portion of the structured data from the compressed data using the codec component; and adding the at least a portion of the structured data to the decompressed data.

14. The method of claim 11, wherein the generating decompressed data using the copy of the respective dictionary includes:

obtaining a prolog entry from the compressed data, wherein the prolog entry includes a compressed string;

generating a decompressed string based on the compressed string;

obtaining a reference to the prolog entry from the compressed data; and adding the decompressed string to the decompressed data based on the reference.

15. The method of claim 10, wherein the generating compressed data includes:

determining a top node in the structured data;

selecting the at least one dictionary entry based on the top node; and recursively generating compressed data based on the top node and a subtree of the top node using the codec component.

16. The method of claim 10, wherein the generating compressed data includes:

identifying a string in the structured data;

translating the string into a encoded string; and adding the encoded string to the compressed data.

17. The method of claim 10, further comprising generating the dictionary, wherein the generating includes:

obtaining schema data that defines a set of all possible patterns for structured data generated using the schema, wherein the schema data is obtained without obtaining any structured data generated using the schema;

detecting a pattern in the schema data;

selecting a codec component from a plurality of codec components based on the pattern;

generating at least one dictionary entry based on the codec component and the pattern; and adding the dictionary entry to the dictionary.

18. The method of claim 17, wherein the detecting the pattern in the schema includes associating one of a plurality of pattern matchers with the pattern, and wherein each of the plurality of codec components is associated with a unique one of the plurality of pattern matchers.

19. A system for managing structured data, the system comprising:

at least one computing device including:
a plurality of pattern matchers, wherein each of the plurality of pattern matchers detects a unique set of aspects of a possible pattern in a schema that defines a set of all possible patterns for structured data generated using the schema; and a system for generating a unique dictionary for each of a set of schemas, wherein the dictionary includes at least one dictionary entry for each pattern in a set of all possible patterns for structured data generated using the corresponding schema, wherein the generating includes, for each schema:
  obtaining schema data that defines the set of all possible patterns for structured data generated using the schema, wherein the schema data is obtained without obtaining any structured data generated using the schema;
  detecting a pattern in the schema data using one of the plurality of pattern matchers and associating the pattern with the one of the plurality of pattern matchers;
  obtaining a codec component based on the one of the plurality of pattern matchers, wherein the codec component is configured to generate compressed data based on the pattern and structured data having the pattern and generates decompressed data based on the compressed data; and
  generating at least one dictionary entry based on the codec component and the pattern, adding the dictionary entry to the dictionary, and storing the dictionary for later use, including storing a respective copy of the dictionary as a discrete file on both a source system and a destination system configured to exchange compressed data therebetween; and
  using at least one copy of the dictionary with at least two distinct structured data files generated using the respective schema, the dictionary entry enabling selection of the codec component when the pattern is detected in the structured data, wherein the using of the at least one copy of the dictionary further includes:
    using the dictionary identifier to select the dictionary from a plurality of available dictionaries;
    processing the prolog entry for each identified string; and
    processing a remainder of the compressed data after the processing of the prolog entry for each identified string.

20. The system of claim 19, the at least one computing device further including a hints system for obtaining a hint for the pattern, wherein the hint identifies all possible values for an element in the pattern, and wherein the generating at least one dictionary entry includes generating at least one dictionary entry based on the hint enabling compression of a value for the element.

21. The system of claim 19, wherein the generating the unique dictionary further includes ordering a plurality of dictionary entries in the dictionary based on an anticipated frequency of occurrence in the structured data.

22. The system of claim 19, wherein a schema in the set of schemas defines a tree structure for the set of all possible patterns, and wherein the corresponding unique dictionary includes a dictionary entry for each possible node in the tree structure.

23. The system of claim 19, further comprising a deployment system for deploying a copy of the unique dictionary for a schema to a system that manages structured data generated using the schema, wherein the unique dictionary is used to compress the structured data generated using the schema.

24. A system for managing structured data, the system comprising:
  at least one computing device including:
    a translation system for generating a unique dictionary based on schema data that defines a set of all possible patterns for structured data generated using a schema, wherein the schema data does not include any structured data, wherein the unique dictionary includes a dictionary entry that associates a codec component that generates compressed data based on a pattern in the structured data and structured data having the pattern for each possible pattern defined in the schema, wherein the translation system includes:
      a plurality of pattern matchers, wherein each of the plurality of pattern matchers is configured to match a unique set of aspects of a possible pattern in the schema;
      a pattern system configured to associate the pattern in the schema with one of the plurality of pattern matchers;
      a codec system configured to obtain the codec component identified with the associated pattern matcher and initialize the codec component to recognize the pattern in the structured data; and
      a dictionary system configured to generate at least one dictionary entry based on the codec component and the pattern and add the at least one dictionary entry to the dictionary; and
    a compression system for generating compressed data based on the structured data generated using the schema and the unique dictionary corresponding to the schema by performing a method comprising:
      adding a dictionary identifier corresponding to the unique dictionary to the compressed data; and
      for each pattern in a set of patterns in the structured data:
        detecting the pattern in the structured data with one of the plurality of pattern matchers;
        selecting a codec component based on the detected pattern and a dictionary entry corresponding to the detected pattern; and
        generating compressed data for the detected pattern based on the structured data corresponding to the detected pattern using the codec component, the compressed data for the detected pattern including an identifier of the dictionary entry corresponding to the detected pattern and a set of arguments for use by the codec component in generating decompressed data;
    identifying any string having a plurality of occurrences in the structured data;
    for each identified string, creating a prolog entry in the compressed data based on the string;
    adding a prolog size to the compressed data, the prolog size indicating a number of prolog entries included in the compressed data;
    referencing the respective prolog entry in the compressed data for each of the plurality of occurrences of the respective identified string; and
    using at least one copy of the dictionary with at least two distinct structured data files generated using the respective schema, wherein the using of the at least one copy of the dictionary includes:
      using the dictionary identifier to select the dictionary from a plurality of available dictionaries;
      processing the prolog entry for each identified string; and
      processing a remainder of the compressed data after the processing of the prolog entry for each identified string.

25. The system of claim 24, wherein the codec component further generates decompressed data based on the compressed data, the system further comprising a decompression system for generating decompressed data based on the compressed data, wherein the generating includes:
  obtaining a copy of the dictionary for use in decompressing the compressed data based on the dictionary identifier in the compressed data, wherein the second dictionary corresponds to the unique dictionary; and
  generating decompressed data using the second dictionary based on the compressed data.

26. The system of claim 25, the at least one computing device further including a communication system for communicating the compressed data from a source system that generates the compressed data to a destination system that generates the decompressed data.

27. The system of claim 24, the at least one computing device further including a deployment system for providing the unique dictionary for a schema to a plurality of systems that manage structured data generated using the schema.

28. The system of claim 24, the at least one computing device further including a schema system for generating the schema data.

29. A program product stored on a non-transitory recordable medium for managing structured data, the program product comprising program code, which when executed, causes a computer system to perform a method comprising:
  generating a unique dictionary for each of a set of schemas, wherein the unique dictionary includes at least one dictionary entry for each pattern in a set of all possible patterns for structured data generated using the corresponding schema, wherein the generating includes, for each schema:
    obtaining schema data that defines the set of all possible patterns for structured data generated using the schema, wherein the schema data is obtained without obtaining any structured data generated using the schema;
    detecting a pattern in the schema data;
    obtaining a codec component based on the pattern, wherein the codec component generates compressed data based on the pattern and structured data having the pattern;
    obtaining a hint for the pattern, wherein the hint identifies all possible values for an element in the pattern;
    generating at least one dictionary entry for the pattern based on the codec component, the hint, and the pattern, the at least one dictionary entry enabling selection of the codec component and compression of a value for the element when the pattern is detected in the structured data;
    adding the at least one dictionary entry to the dictionary; and
    storing the dictionary for later use in compressing structured data generated using the schema, including storing a respective copy of the dictionary as a discrete file on both a source system and a destination system configured to exchange compressed data therebetween;
  generating compressed data for the structured data using the dictionary, wherein the generating of the compressed data includes:
    adding a dictionary identifier corresponding to the dictionary to the compressed data;
    identifying any string having a plurality of occurrences in the structured data;
    creating a prolog entry, in the compressed data, for each identified string, after the identifying of the any string; and
    referencing the respective prolog entry in the compressed data for each of the plurality of occurrences of the respective identified string; and
  using at least one copy of the dictionary with at least two distinct structured data files generated using the respective schema, wherein the using of the at least one copy of the dictionary includes:
    using the dictionary identifier to select the dictionary from a plurality of available dictionaries;
    processing the prolog entry for each identified string; and
    processing a remainder of the compressed data after the processing of the prolog entry for each identified string.

30. The program product of claim 29, wherein the-detecting includes:
  obtaining a plurality of pattern matchers, each pattern matcher configured to match a unique set of aspects of a possible pattern in the schema; and
  associating the pattern with one of the plurality of pattern matchers, and wherein the obtaining a codec component includes:
    obtaining the codec component identified with the associated pattern matcher; and
    initializing the codec component to recognize the pattern in the structured data.

31. A method for deploying an application for managing structured data, the method comprising:
  providing a computer infrastructure including at least one computing device, the computer infrastructure being operable to:
    generate a unique dictionary for each of a set of schemas, wherein the dictionary includes at least one dictionary entry for each pattern in a set of all possible patterns for structured data generated using the corresponding schema, wherein the generating includes, for each schema:
      obtaining schema data that defines the set of all possible patterns for structured data generated using the schema, wherein the schema data is obtained without obtaining any structured data generated using the schema;
      detecting a pattern in the schema data;
      obtaining a codec component based on the pattern, wherein the codec component is configured to generate compressed data based on the pattern and structured data having the pattern;
      obtaining a hint for the pattern, wherein the hint identifies all possible values for an element in the pattern;
      generating at least one dictionary entry for the pattern based on the codec component, the hint, and the pattern, the at least one dictionary entry enabling selection of the codec component and compression of a value for the element when the pattern is detected in the structured data;
      adding the at least one dictionary entry to the dictionary; and
      storing the dictionary for later use in compressing structured data generated using the schema, including storing a respective copy of the dictionary as a discrete file on both a source system and a destination system configured to exchange compressed data therebetween;

generate compressed data for the structured data using the dictionary, wherein the generating of the compressed data includes:
adding a dictionary identifier corresponding to the dictionary to the compressed data
identifying any string having a plurality of occurrences in the structured data;
creating a prolog entry, in the compressed data, for each identified string, after the identifying of the any string; and
referencing the respective prolog entry in the compressed data for each of the plurality of occurrences of the respective identified string; and
use at least one copy of the dictionary with at least two distinct structured data files generated using the respective schema, wherein the using of the at least one copy of the dictionary includes:
using the dictionary identifier to select the dictionary from a plurality of available dictionaries;
processing the prolog entry for each identified string; and
processing a remainder of the compressed data after the processing of the prolog entry for each identified string.

32. Computer software embodied in a physical non-transitory recordable medium for managing structured data, the computer software comprising instructions to cause a computer system to perform the following:
determine a schema used to generate the structured data;
obtain a dictionary based on the schema, wherein the dictionary includes at least one dictionary entry for each pattern in a set of all possible patterns for structured data generated using the corresponding schema;
generate compressed data for the structured data using the dictionary by performing the following:
add a dictionary identifier corresponding to the dictionary to the compressed data; and
for each pattern in a set of patterns in the structured data:
detect the pattern in the structured data;
select a codec component based on the detected pattern and a dictionary entry corresponding to the detected pattern;
obtain compressed data for a value of an element in the pattern from a second dictionary entry corresponding to the element in the pattern;
generate compressed data for the detected pattern based on the structured data corresponding to the detected pattern using the codec component and the compressed data for the value of the element, the compressed data for the detected pattern including an identifier of the dictionary entry corresponding to the detected pattern and a set of arguments for use by the codec component in generating decompressed data;
identify any string having a plurality of occurrences in the structured data;
for each identified string, create a prolog entry in the compressed data based on the string;
add a prolog size to the compressed data, the prolog size indicating a number of prolog entries included in the compressed data;
reference the respective prolog entry in the compressed data for each of the plurality of occurrences of the respective identified string; and
use at least one copy of the dictionary with at least two distinct structured data files generated using the respective schema, wherein the using of the at least one copy of the dictionary includes:
using the dictionary identifier to select the dictionary from a plurality of available dictionaries;
processing the prolog entry for each identified string; and
processing a remainder of the compressed data after the processing of the prolog entry for each identified string.

33. The computer software of claim 32, wherein the instructions further cause the computer system to communicate the compressed data to a destination system.

* * * * *